(12) United States Patent
Kim et al.

(10) Patent No.: US 8,119,437 B2
(45) Date of Patent: Feb. 21, 2012

(54) METHODS OF MANUFACTURING AN IMAGE SENSOR

(75) Inventors: Jung-Saeng Kim, Seoul (KR); June-Taeg Lee, Suwon-si (KR); Sung-Kwan Kim, Hwaseong-si (KR); Jeong-Wook Ko, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 296 days.

(21) Appl. No.: 12/458,087

(22) Filed: Jun. 30, 2009

(65) Prior Publication Data
US 2010/0009493 A1    Jan. 14, 2010

(30) Foreign Application Priority Data
Jul. 14, 2008    (KR) ................. 10-2008-0068238

(51) Int. Cl.
*H01L 31/0232* (2006.01)
(52) U.S. Cl. .......................................... 438/70
(58) Field of Classification Search .................. None
See application file for complete search history.

(56) References Cited

U.S. PATENT DOCUMENTS

| 6,734,031 | B2 | 5/2004 | Shizukuishi |
| 7,199,931 | B2 | 4/2007 | Boettiger et al. |
| 2008/0049126 | A1* | 2/2008 | Ford et al. ............... 348/294 |
| 2008/0316607 | A1* | 12/2008 | Park ........................ 359/642 |

FOREIGN PATENT DOCUMENTS

| JP | 2003-332547 | 11/2003 |
| KR | 10-0718785 | 5/2007 |

* cited by examiner

*Primary Examiner* — Zandra Smith
*Assistant Examiner* — Pamela E Perkins
(74) *Attorney, Agent, or Firm* — Harness, Dickey & Pierce, P.L.C.

(57) ABSTRACT

The method of manufacturing an image sensor includes providing a semiconductor substrate including a first pixel region, first forming a first pattern on the first pixel region, first performing a reflow of the first pattern to form a sub-micro lens on the first pixel region, second forming a second pattern on the sub-micro lens, and second performing a reflow of the second pattern to form a first micro lens covering the sub-micro lens.

20 Claims, 11 Drawing Sheets

METHODS OF MANUFACTURING AN IMAGE SENSOR

PRIORITY STATEMENT

This U.S. non-provisional patent application claims priority under 35 U.S.C. §119 of Korean Patent Application No. 10-2008-0068238, filed on Jul. 14, 2008, the entire contents of which are herein incorporated by reference in their entirety.

BACKGROUND

Example embodiments disclosed herein relate to methods of manufacturing an image sensor, for example, to a method of manufacturing an image sensor than can improve an efficiency of concentrating a light.

Generally, an image sensor is a semiconductor device converting an optical image into an electric signal. The image sensor may be divided into a charge coupled device (CCD) and a CMOS image sensor.

An image sensor includes a photoelectric conversion device which detects a light and converts it into an electric signal, and logic devices which convert a signal transmitted from the photoelectric conversion device into data. As an area of a photoelectric conversion device, for example a photodiode, of the image sensor increases, a photo sensitivity of the image sensor improves.

Thus, an effort to increase in a fill factor, which is a ratio of an area of a photodiode to an area of an image sensor, may result in an increased photo sensitivity of the image sensor. However, as a pixel size decreases, the amount an area of a photodiode may be increased becomes more limited.

SUMMARY

Example embodiments provide a method of manufacturing an image sensor. According to an example embodiment, a method of manufacturing an image sensor includes providing a semiconductor substrate including a first pixel region, first forming a first pattern on the first pixel region, first performing a reflow of the first pattern to form a sub-micro lens on the first pixel region, second forming a second pattern on the sub-micro lens, and second performing a reflow of the second pattern to form a first micro lens covering the sub-micro lens.

According to an example embodiment, a method of manufacturing an image sensor includes providing a semiconductor substrate including first, second and third pixel regions, first forming a first pattern on the first pixel region and a second pattern on the second pixel region, first performing a reflow of the first and second patterns to form a sub-micro lens on the first pixel region and a first micro lens on the second pixel region, second forming a third pattern on the sub-micro lens and a fourth pattern on the third pixel region, and second performing a reflow of the third and fourth patterns to form a second micro lens covering the sub-micro lens and a third micro lens on the third pixel region.

BRIEF DESCRIPTION

The above and other features and advantages of the present invention will become more apparent by describing in detail example embodiments thereof with reference to the attached drawings in which.

DETAILED DESCRIPTION

The present invention now will be described more fully hereinafter with reference to the accompanying drawings, in which example embodiments of the invention are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Figure 1:
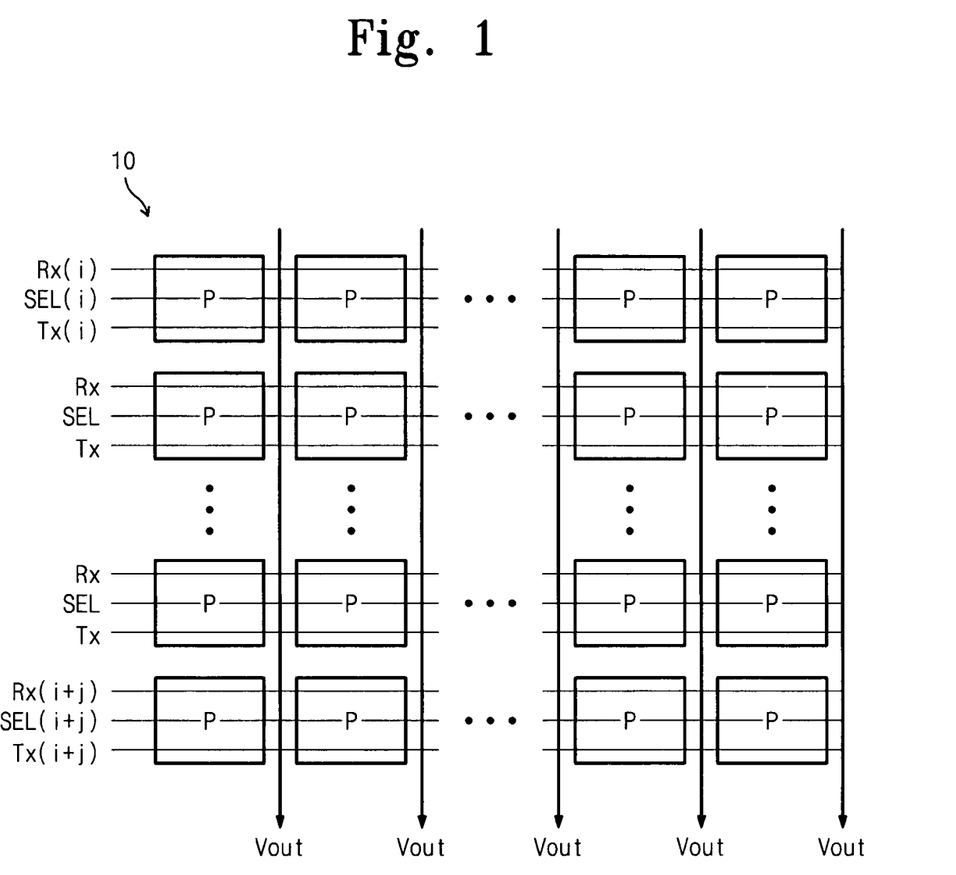
FIG. 1 is a simplified view of a pixel sensor array of an image sensor according to an example embodiment of the present invention.
Figure 2:
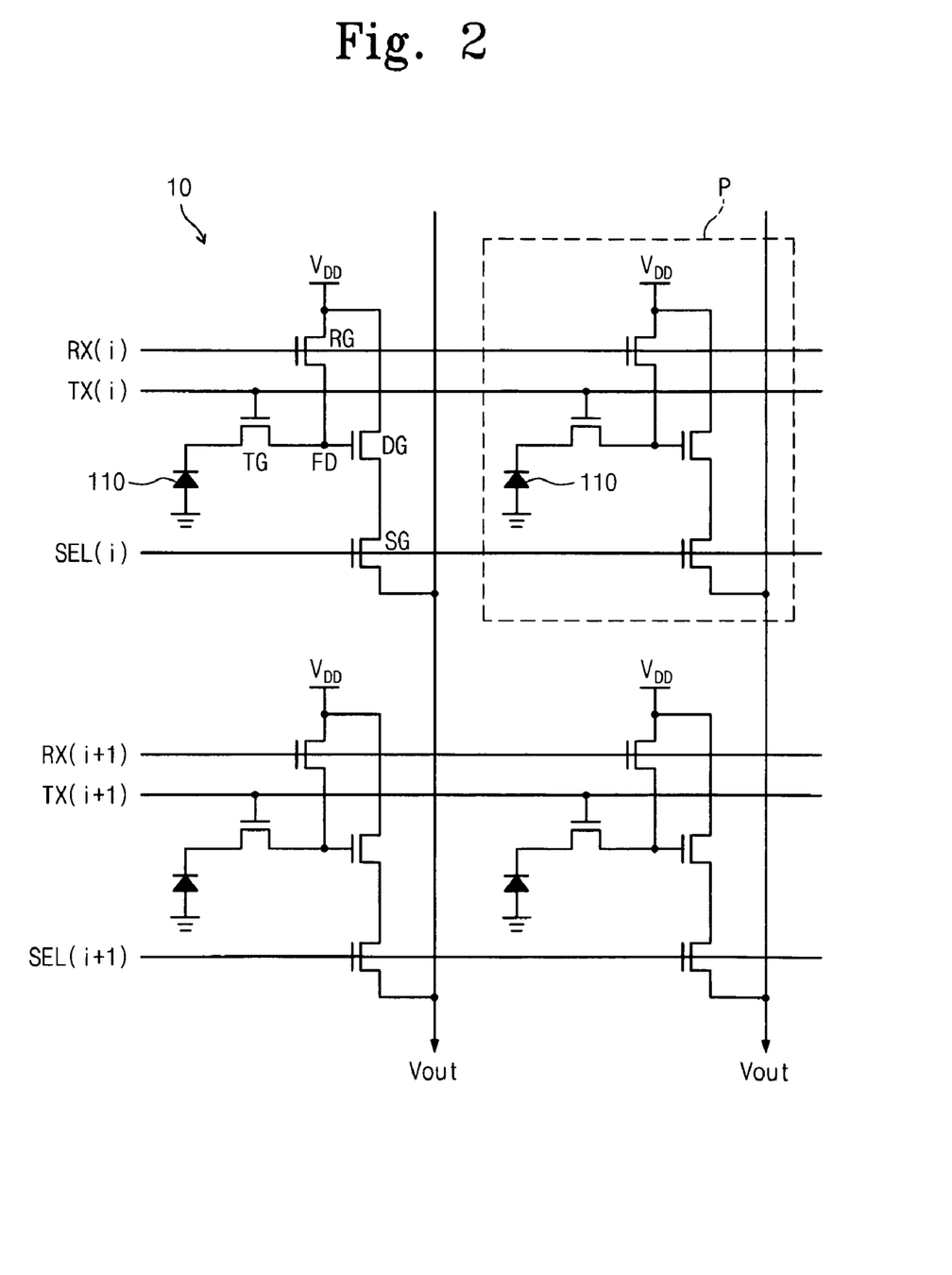
FIG. 2 is a unit pixel circuit of an image sensor according to an example embodiment of the present invention.

First, referring to FIGS. 1 and 2, a structure of an image sensor according to embodiments of the present invention will be briefly described. The image sensor according to embodiments of the present invention may, for example, be a CMOS image sensor. However, the technical scope of the present invention can be applied to a charge coupled device (CCD) and display devices.

FIG. 1 is a simplified view of a pixel sensor array of an image sensor according to an example embodiment of the present invention. FIG. 2 is a unit pixel circuit of an image sensor according to an example embodiment of the present invention.

As depicted in FIGS. 1 and 2, an active pixel sensor array 10 of an image sensor, which converts an optical signal into an electric signal, includes a plurality of unit pixels (P) arranged in a matrix shape.

The unit pixels (P) may, for example, have a three transistor structure, a four transistor structure, a five transistor structure or a photo gate structure. However, example embodiments may have structures with less than three transistors or more than five transistors. The unit pixels (P) shown in FIG. 2 have the four transistor structure according to an example embodiment of the present invention.

Each of the unit pixels (P) including the four transistor structure may also include a photoelectric conversion device 110, which receives light to generate or store a photo charge and a reading device, for example, the four transistor structure, which reads a photo signal generated from the photoelectric conversion device 110. The reading device may include a reset device (RG), an amplification device (DG) and a selection device (SG).

In more detail, the photoelectric conversion device 110 generates and stores a charge corresponding to an incident light. The photoelectric conversion device 110 may be formed of a photo diode, a photo transistor, a photo gate, a pinned photo diode and combinations thereof. The photoelectric conversion device 110 is connected to a charge transmission device (TG) transmitting a photo charge stored to a detection device (FD).

A floating diffusion region is generally used as the detection device (FD) and receives a charge stored in the photoelectric conversion device 110. The detection device (FD) accumulatively stores a charge. Also, the detection device (FD) is electrically connected to the amplification device (DG) in order to control the amplification device (DG).

The charge transmission device (TG) transmits a charge to the detection device (FD) from the photoelectric conversion device 110. The charge transmission device (TG) generally includes a transistor and is controlled by a charge transmission signal (TX(i)).

The reset device (RG) periodically resets the detection device (FD). A source of the reset device (RG) is connected to the detection device (FD) and a drain of the reset device (RG) is connected to a power supply voltage ($V_{DD}$). The reset device (RG) is operated by a bias provided by a reset signal (RX(i)). When the reset device (RG) is turned on by a bias provided by a reset signal (RX(i)), the power supply voltage ($V_{DD}$) connected to a drain of the reset device (RG) is transmitted to the detection device (FD). Thus, when the reset device (RG) is turned on, the detection device (FD) may be reset.

The amplification device (DG) is combined with a constant current source (not shown) to function as a source follower buffer amplifier. The amplification device (DG) amplifies a change of an electrical potential of the detection device (FD) to transmit it to an output line (Vout).

The selection device (SG) selects unit pixels by a row unit. The selection device (SG) is operated by a bias provided by a row selection line (SEL(i)). When the selection device (SG) is turned on, a power supply voltage connected to a drain of the amplification device (DG) is transmitted to a drain of the selection device (SG).

Operating signal lines (TX(i), RX(i), SEL(i)) of the charge transmission device (TG), the reset device (RG) and the selection device (SG) are extended in a row direction so that unit pixels included in the same row are simultaneously operated.

Hereinafter, referring to FIGS. 3A, 4A, 5A, 6A, 7A and 8A and FIGS. 3B, 4B, 5B, 6B, 7B and 8B, a method of manufacturing an image sensor according to an example embodiment of the present invention will be described in detail.

FIGS. 3A, 4A, 5A, 6A, 7A and 8A are top plan views sequentially illustrating a method of manufacturing an image sensor according to an example embodiment of the present invention. FIGS. 3B, 4B, 5B, 6B, 7B and 8B are cross sectional views taken along the line B-B' of respective FIGS. 3A, 4A, 5A, 6A, 7A and 8A illustrating a method of manufacturing an image sensor according to an example embodiment of the present invention.

Referring to FIGS. 3A, 4A, 5A, 6A, 7A and 8A, for unit pixels (P) of an active pixel sensor array 10 arranged in a matrix shape, a substrate 100 may be divided into unit pixel regions ($P_R$, $P_G$, $P_B$) of a square shape. Further, the unit pixel regions ($P_R$, $P_G$, $P_B$) may be divided into first through third pixel regions depending on a wavelength of an incident light.

The first pixel region is a region where a light of a first wavelength is inputted and the second pixel region is a region where a light of a second wavelength is inputted. The third pixel region is a region where a light of a third wavelength is inputted. In an example embodiment of the present invention, the first pixel region is a blue pixel region ($P_B$) where a blue light is inputted and the second pixel region is a red pixel region ($P_R$) where a red light is inputted. The third pixel region is a green pixel region ($P_G$) where a green light is inputted.

Figure 3A:
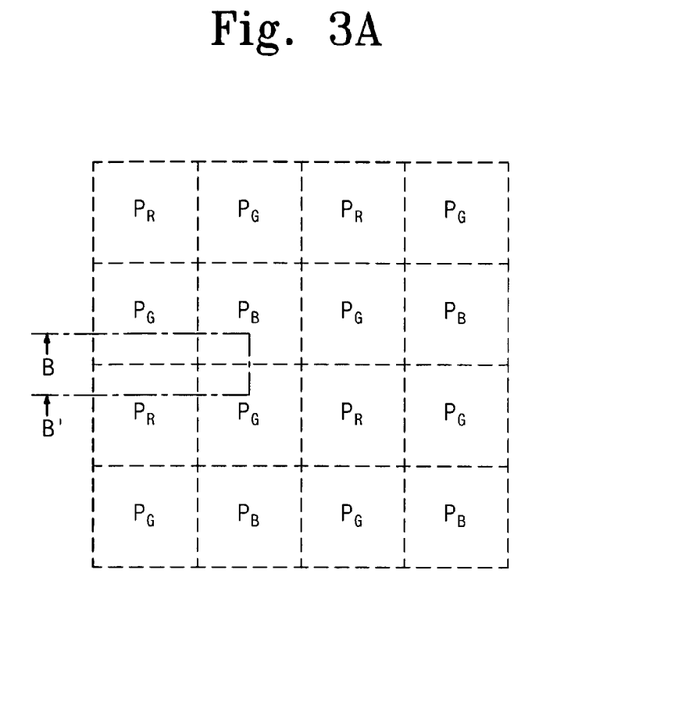
FIGS. 3A, 4A, 5A, 6A, 7A and 8A are top plan views sequentially illustrating a method of manufacturing an image sensor according to an example embodiment of the present invention.
Figure 3B:
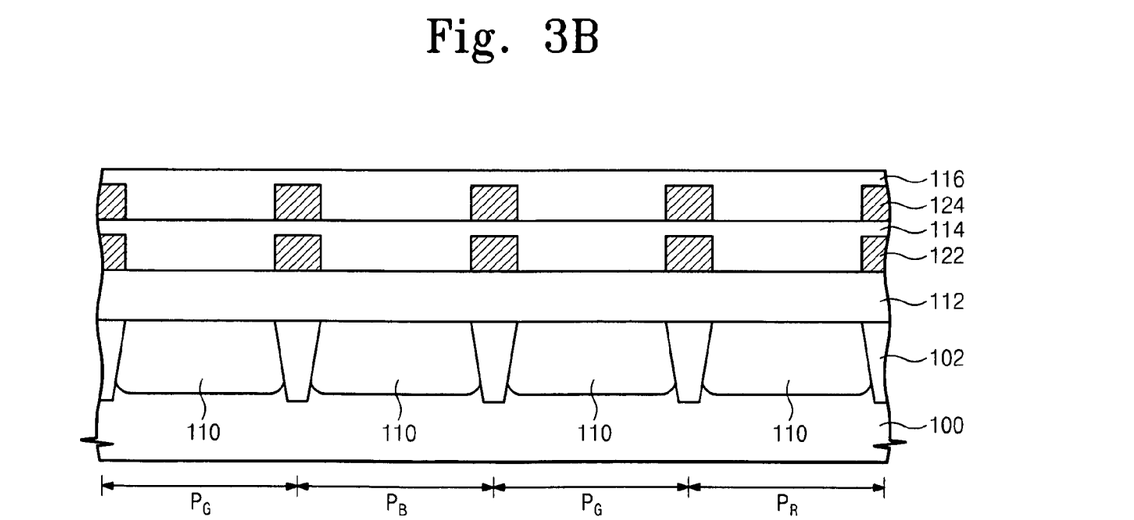
FIGS. 3B, 4B, 5B, 6B, 7B and 8B are cross sectional views taken along the line B-B' of respective FIGS. 3A, 4A, 5A, 6A, 7A and 8A illustrating a method of manufacturing an image sensor according to an example embodiment of the present invention.

First, a device isolation layer 102 is formed in a substrate 100 including a plurality of unit pixel regions ($P_R$, $P_G$, $P_B$). The device isolation layer 102 may be formed by applying a local oxidation of silicon (LOCOS) process or a shallow trench isolation (STI) process to an entire surface of the substrate 100. The device isolation layer 102 divides the plurality of unit pixel regions ($P_R$, $P_G$, $P_B$) into each unit pixel region ($P_R$, $P_G$, $P_B$) and defines a field region and an active region in each unit pixel region ($P_R$, $P_G$, $P_B$).

Next, a plurality of transistors (not shown) are formed on the substrate 100. In more detail, a charge transmission device (TG of FIG. 2), a reset device (RG of FIG. 2), an amplification device (DG of FIG. 2) and a selection device (SG of FIG. 2) are formed in a unit pixel region.

Then, a photoelectric conversion device 110 is formed on each unit pixel region ($P_R$, $P_G$, $P_B$). The photoelectric conversion device 110 may, for example, be a photo diode, a photo gate or a photo transistor.

For example, a photo diode 110 may be formed by implanting an N type impurity into the substrate 100 of each unit pixel region ($P_R$, $P_G$, $P_B$). A pinned photo diode (not shown) may be formed by implanting a P type impurity into a surface of the photo diode 110.

After forming an active pixel sensor (APS) array having a plurality of unit pixel regions ($P_R$, $P_G$, $P_B$) including the photoelectric conversion device 110, respectively, a plurality of interlayer insulating layers 112, 114 and 116, and interconnections 122 and 124 may be formed. At this time, an etching stop layer (not shown) may be formed on each interface of the interlayer insulating layers 112, 114 and 116.

The interlayer insulating layers 112, 114 and 116 are formed of a material having a high or superior gap fill characteristic and top surfaces of the interlayer insulating layers 112, 114 and 116 are formed to be relatively flat. For example, high density plasma (HDP), tonen silazene (TOSZ), spin on glass (SOG) and undoped silica glass (USG) may be used as the interlayer insulating layers 112, 114 and 116. A silicon nitride layer may be used as an etching stop layer (not shown).

The interconnections 122 and 124 may be formed by depositing a conductive material on the interlayer insulating layers 112, 114 and 116 and patterning them. For example, metal material such as copper, tungsten, titanium, tantalum and aluminum may be used as the conductive material.

The interconnections 122 and 124 formed on each of the interlayer insulating layers 112, 114 and 116 may be connected to each other or to other underlying devices through contacts (not shown). An arrangement of the interconnections 122 and 124 for an electrical routing and/or a lightproof function of devices of the active pixel sensor (APS) array (10 of FIG. 1) may be changed or varied by those skilled in the art, according to an example embodiment of the present invention.

Figure 4A:
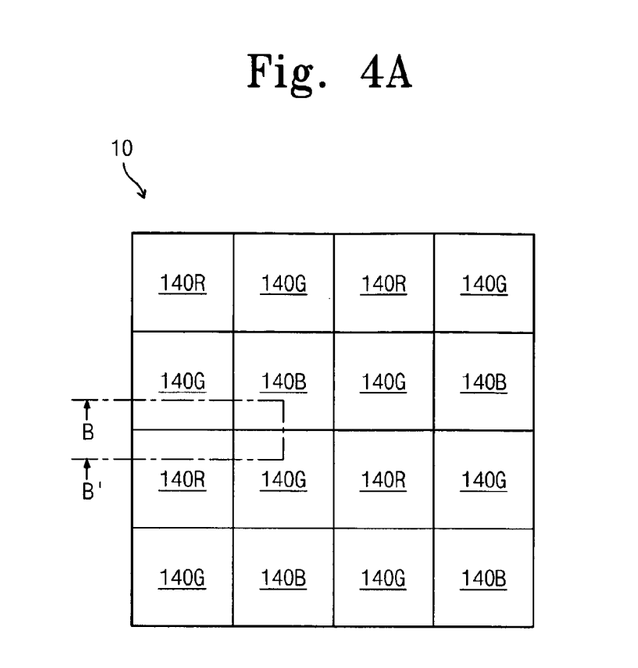
Figure 4B:
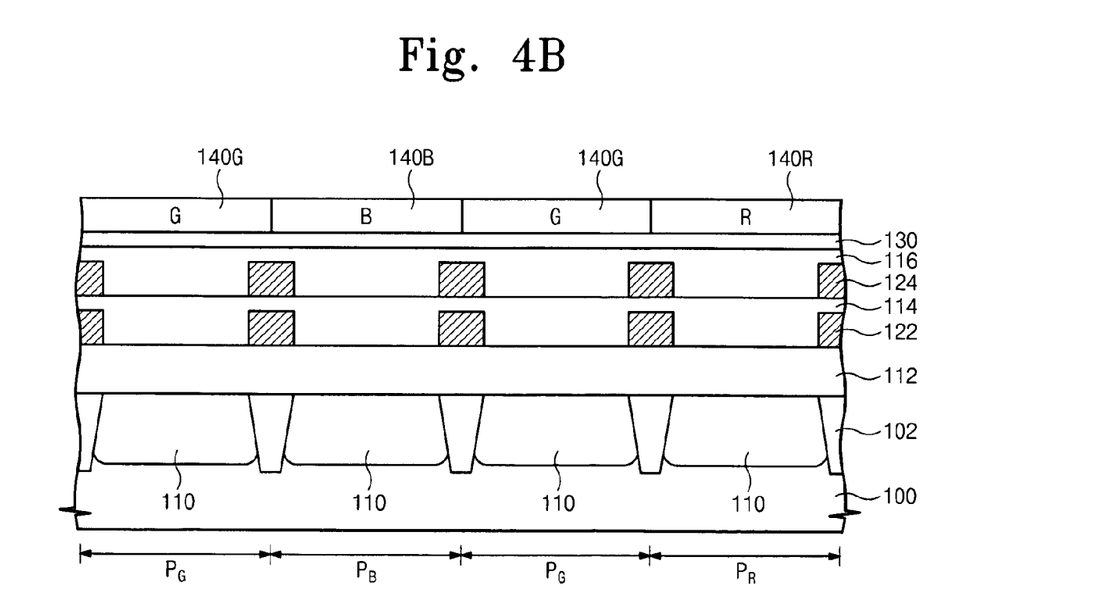

After the interlayer insulating layers 112, 114 and 116 and the interconnections 122 and 124 are formed on the substrate 100, a lower planarization layer 130 may be formed as depicted in FIGS. 4A and 4B.

The lower planarization layer 130 is formed to cope with a step difference of a surface of the top interlayer insulating layer 116 due to the interconnections 122 and 124 and to prevent underlying devices from being corroded by dyes during a formation of a color filter layer 140 which is subsequently formed. The lower planarization layer 130 may be formed using polyimid system material or polyacryl system material having a high or superior light permeability.

Before forming the lower planarization layer 130, a light penetrating portion (not shown) composed of a material which can improve a light transmittance may be separately formed on an upper portion of the photoelectric conversion device 110 in order to improve a transmittance of an incident light and to prevent a crosstalk between unit pixels.

A color filter layer 140 is formed on the lower planarization layer 130. A light of a specified color penetrates the color filter layer 140 to reach the photoelectric conversion device 110 in order to obtain a high definition image. Here, the color filter layer 140 includes a red color filter 140R, a green color filter 140G and a blue color filter 140B corresponding to each unit pixel region ($P_R$, $P_G$, $P_B$). The color filter layer 140 may be formed, for example, using a dyeing method, a pigment dispersion method or a printing method. The color filter layer 140 may be formed of a dyed photoresist.

As depicted in FIG. 4A, the red color filter 140R, the green color filter 140G and the blue color filter 140B of the color filter layer 140 may be disposed in the shape of a Bayer filter so as to correspond to each unit pixel region ($P_R$, $P_G$, $P_B$).

In the Bayer filter shape, green color filter 140G are arranged to occupy half a portion of the color filter layer 140, which is because a human's eyes most sensitively react to the color green. However, the color filters (140R, 140G, 140B) may be diversely arranged and example embodiment are not limited to the Bayer filter. Also, the color filter layer 140 may be formed of color filters other than red, green or blue color filters.

Figure 5A:
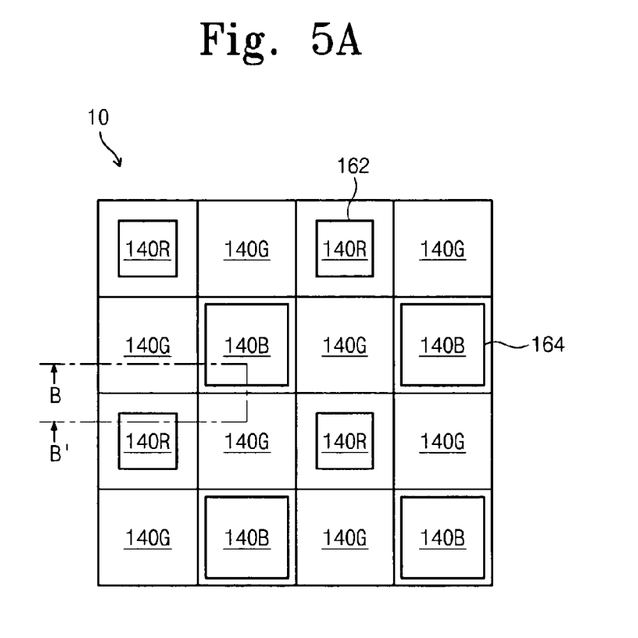
Figure 5B:
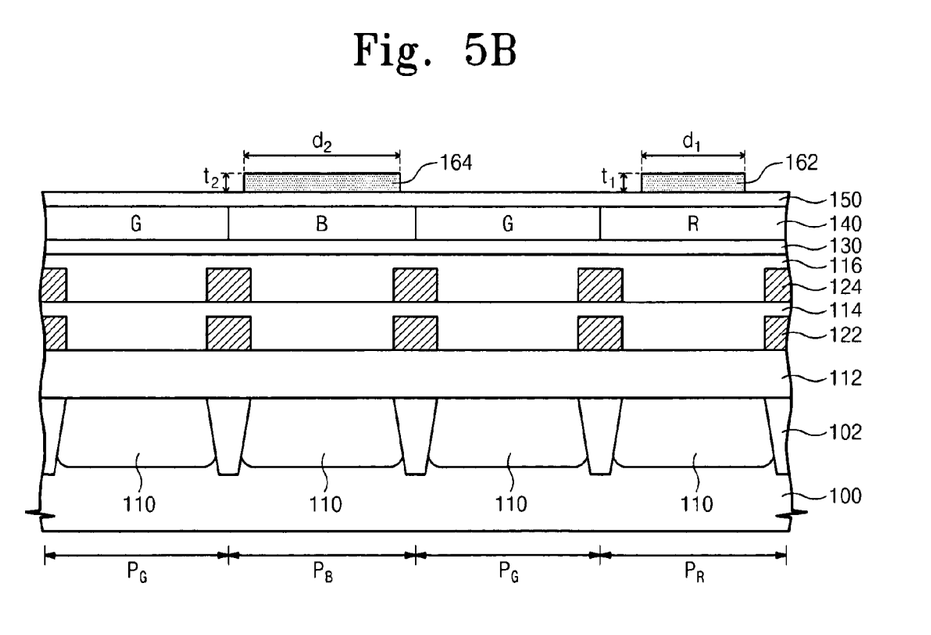

Referring to FIGS. 5A and 5B, an upper planarization layer 150 referred to as an over-coating layer (OCL) may be formed on the color filter layer 140. The upper planarization layer 150 may be formed of a thermal hardening resin.

Micro lenses are formed on the upper planarization layer 150 so as to correspond to each unit pixel region ($P_R$, $P_G$, $P_B$).

In more detail, first and second patterns 162 and 164 form micro lenses and are formed on an upper planarization layer 150 of a red pixel region ($P_R$) and a blue pixel region ($P_B$).

After forming a light penetrating material layer on the upper planarization layer 150, the light penetrating material layer is patterned to form the first and second patterns 162 and 164 on the red and blue pixel regions ($P_R$, $P_B$), respectively. For example, the first and second patterns 162 and 164 may be formed by patterning a light penetrating photoresist layer.

The first and second patterns 162 and 164 may be formed on center portions of the red and blue pixel regions ($P_R$, $P_B$), respectively. The first and second patterns 162 and 164 may be formed so as to not completely cover respective red and blue pixel regions ($P_R$, $P_B$) in consideration of an increase in surface area of the first and second patterns 162 and 164 by a subsequent reflow process.

The first and second patterns 162 and 164 may be disposed to be symmetrical to each other on an active pixel sensor (APS) array of a matrix shape. For example, the first and second patterns 162 and 164 may be disposed on a different row and a different column. The first and second patterns 162 and 164 may be formed to have a plane structure of a square shape. The first and second patterns 162 and 164 may also be formed to have a different plane structure of a pentagonal shape or a hexagonal shape.

Areas of the first and second patterns 162 and 164 are formed to be different so as to form micro lenses having a different radius of curvature. For example, an area of the first pattern 162 on the red pixel region ($P_R$) where a light of a long wavelength is inputted is formed to be smaller than an area of the second pattern 164 on the blue pixel region ($P_B$). For example, when the first and second patterns 162 and 164 are formed to have the same first thickness ($t_1$), a first width (d1) of the first pattern 162 may be formed to be smaller than a second width ($t_2$) of the pattern 164. The second pattern 164 may be formed to have a size such that a micro lens can completely cover the blue pixel region ($P_B$) by a subsequent reflow process.

Figure 6A:
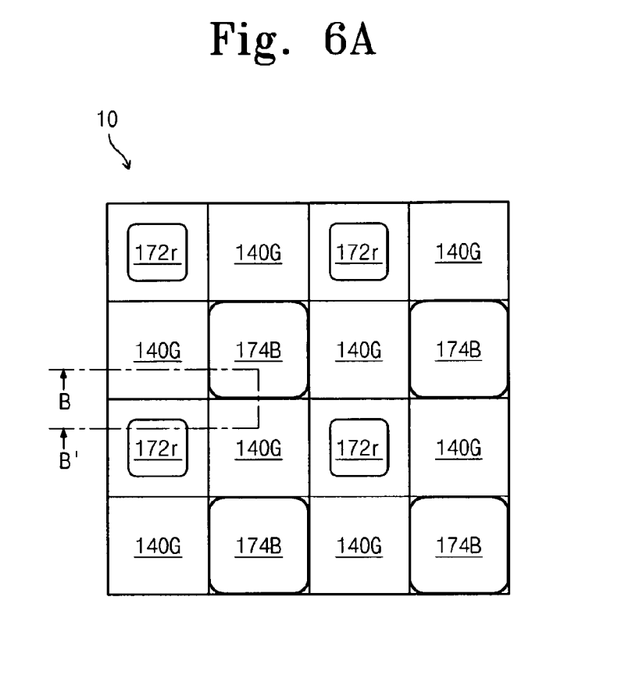
Figure 6B:
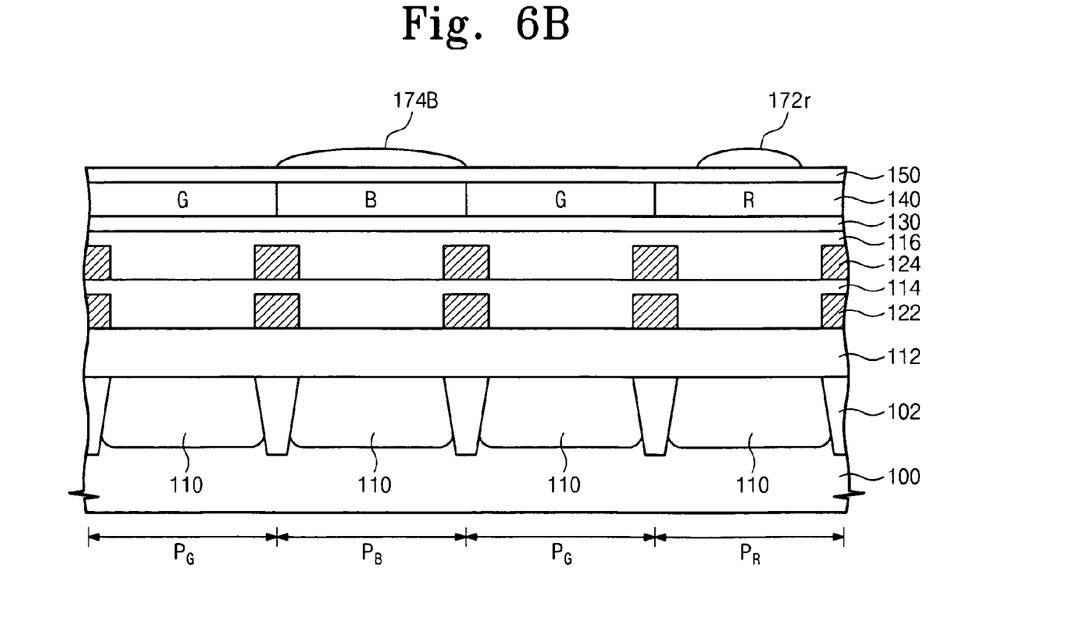

Referring to FIGS. 6A and 6B, a thermal process is applied to the first and second patterns 162 and 164 to form a sub-micro lens 172r and a first micron lens 174B which have a convex shape and a predetermined or fixed curvature. Since a reflow of the first and second patterns 162 and 164 is performed by a thermal process, a curved surface may be formed by a surface tension. The sub-micro lens 172r and the first micron lens 174B may have a curved surface. Thus, each of thicknesses the sub-micro lens 172r and the first micron lens 175B gradually decreases moving away from a center towards an edge of the lenses 172r and 175b.

The sub-micro lens 172r only covers a center of the red pixel region ($P_R$) and the first micron lens 174B can completely cover the blue pixel region ($P_B$). A radius of a curvature of the sub-micro lens (172r) may be formed to be smaller than a radius of a curvature of the first micron lens (174B).

Also, a plane structure of the sub-micro lens 172r and the first micron lens 174B may be different depending on a plane structure of the first and second patterns 162 and 164. For example, if the first and second patterns 162 and 164 of a square shape reflow, edges of the first and second patterns 162 and 164 may be rounded as depicted in FIG. 6A.

After the sub-micro lens 172r and the first micron lens 174B are formed, a bake process may be performed so as to prevent a deformation of the micron lens 172r and 174B due to a subsequent process and to maintain a shape of the micron lens 172r and 174B.

Figure 7A:
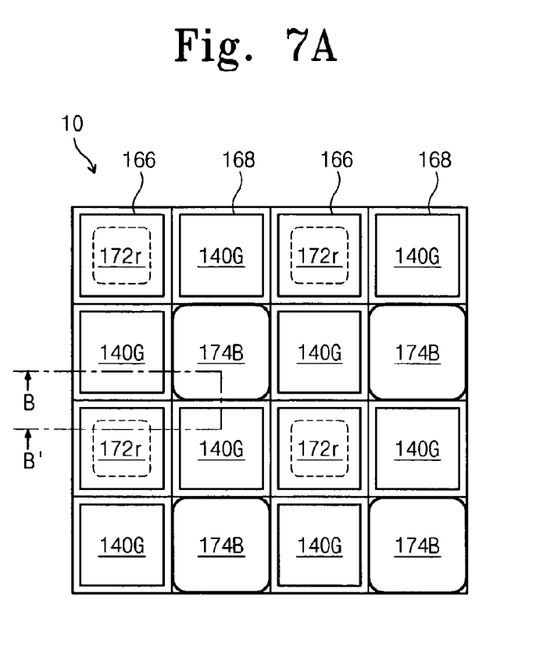
Figure 7B:
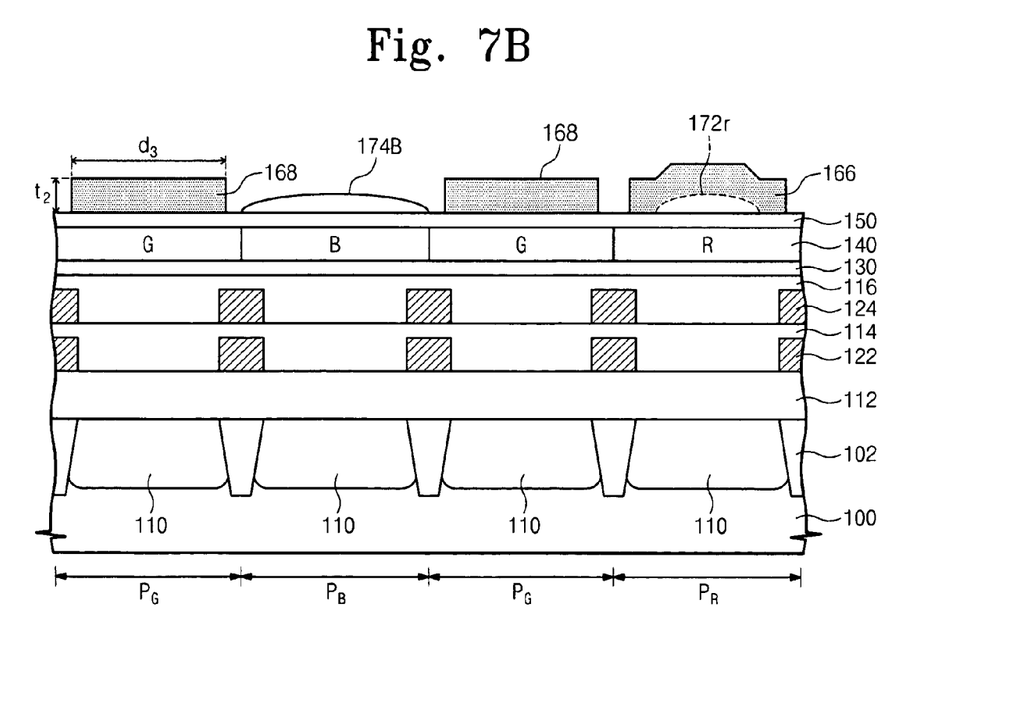

As depicted in FIGS. 7A and 7B, a third pattern 166 covering the sub-micro lens 172r is formed on the red pixel region ($P_R$) and a fourth pattern 168 is formed on an upper planarization layer 150 of the green pixel region ($P_G$).

More specifically, after a light penetrating material layer is conformally formed on the upper planarization layer 150 where the sub-micro lens 172r is formed, the light penetrating material layer is patterned to form the third and fourth patterns 166 and 168. The third and fourth patterns 166 and 168 may be formed of the same material as the first and second patterns 162 and 164.

If the third and fourth patterns 166 and 168 have the same thickness as the second pattern 164. Areas of the third and fourth patterns 166 and 168 may be formed to be greater than an area of the second pattern 164. Volumes of the third and fourth patterns 166 and 168 may be formed to be greater than a volume of the second pattern 164 so as to form a micron lens on the red and green pixel regions ($P_R$, $P_G$) having a radius of curvature smaller than the first micron lens 174B of the blue pixel region ($P_B$).

The third and fourth patterns 166 and 168 may have a second thickness ($t_2$) greater than the first thickness ($t_1$) of the first and second patterns 162 and 164. The third and fourth patterns 166 and 168 may be formed to have a third width ($d_3$) greater than the first width ($d_1$) of the first pattern 162 and smaller than the second width ($d_2$) of the second pattern 164.

The third pattern 166 covering the sub-micro lens 172r has a second thickness ($t_2$) which is the same size as the fourth pattern 168 and may have a pattern structure conformally formed along a surface of the sub-micro lens 172r.

The third and fourth patterns 166 and 168 may have various plane types, such as a square, a pentagon or a hexagon, and may be formed to not completely cover each unit pixel region ($P_R$, $P_G$).

Figure 8A:
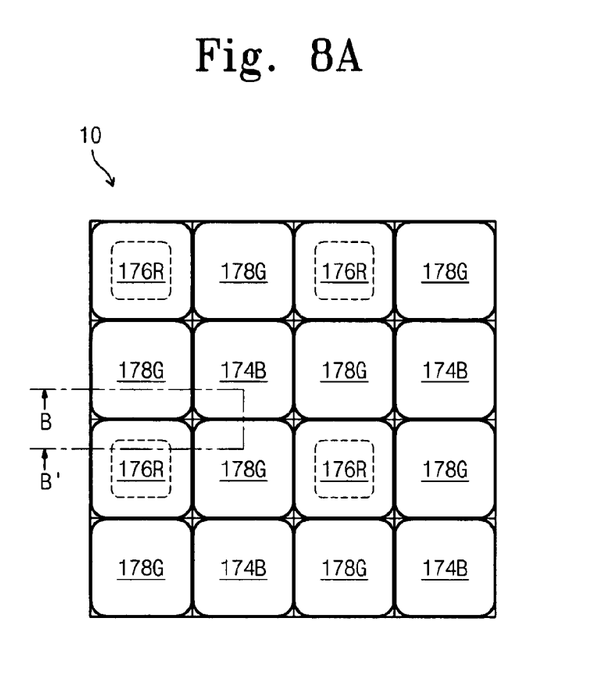
Figure 8B:
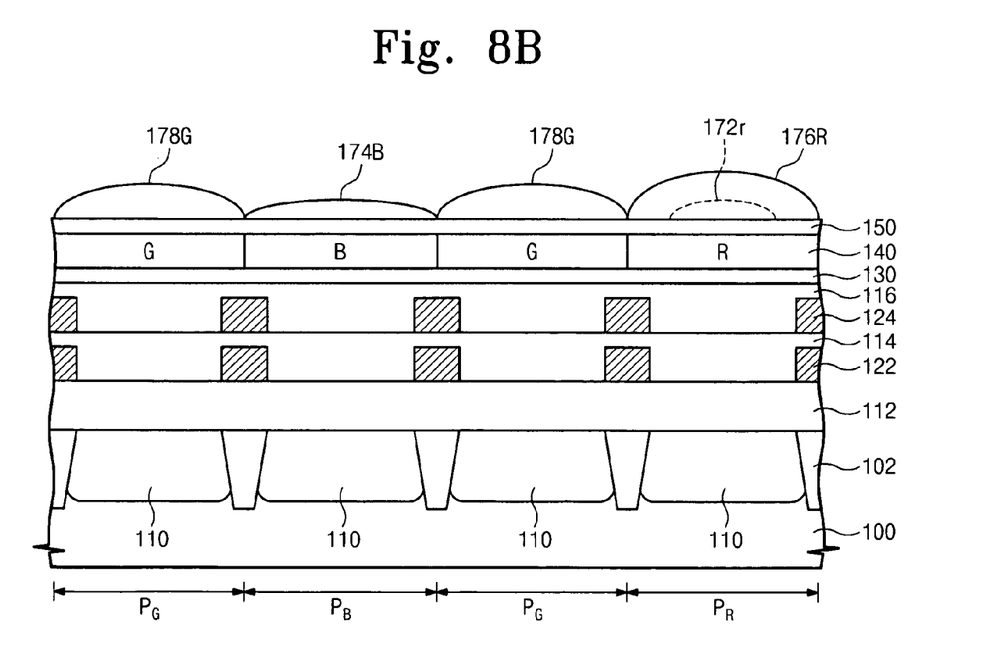

Referring to FIGS. 8A and 8B, a thermal process is applied to the third and fourth patterns 166 and 168 to form a second micro lens 176R on the red pixel region ($P_R$) and a third micro lens 178G on the green pixel region ($P_G$). For example, the third and fourth patterns 166 and 168 reflow to form the second and third micro lens 176R and 178G covering the red pixel region ($P_R$) and the green pixel region ($P_G$), respectively.

The second micro lens 176R may be formed to completely cover the sub-micro lens 172r. Thus, the second micro lens 176R including the sub-micro lens 172r constitutes one micro lens concentrating a red light. Here, since the sub-micro lens 172r and the second micro lens 176R are formed of the same material, a light is not refracted at an interface between the sub-micro lens 172r and the second micro lens 176R.

A radius of a curvature of the second micro lens 176R on the red pixel region ($P_R$) may be smaller than that of the first and third micro lenses 174B and 178G by the sub-micro lens 172r already formed. Thus, the second micro lens 176R can reduce a focal distance of a red line corresponding to a relatively long wavelength.

The third micro lens 178G is formed by the fourth pattern 168 having the thickness ($t_2$) greater than the second pattern (164 of FIG. 5B) for forming the first micro lens 174B on the blue pixel region PB. Thus, the third micro lens 178G may be formed to have a radius of a curvature smaller than the first micro lens 174B on the blue pixel region ($P_B$) and greater than the second micro lens 176R on the red pixel region ($P_R$).

A reflow of the third and fourth patterns 166 and 168 is performed by a thermal process, so that the second and third micro lenses 176R and 178G completely cover the each unit pixel region ($P_R$, $P_G$). The second and third micro lenses 176R and 178G may have a curved surface having a gradually reduced thickness moving away from a center towards an edge of the second and third micro lenses 176R and 178G, respectively. The second and third micro lenses 176R and 178G may have a plane structure of a square shape having a rounded edge. The plane structure may become different depending on a plane shape of the third and fourth patterns 166 and 168.

After the second and third micro lenses 176R and 178G are formed, a bake process may be performed to maintain shapes of the second and third micro lenses 176R and 178G.

According to the method described above, the micro lenses 174B, 176R and 178G are formed on each of the unit pixel regions ($P_R$, $P_G$, $P_B$). The micro lenses 174B, 176R and 178G may have different radiuses of a curvature according to a wavelength of a light which is to be inputted.

The second micro lens 176R on the red pixel region ($P_R$), where a red light of relatively long wavelength compared with a green light or a blue light is inputted, is formed to have the smallest radius of a curvature. The first micro lens 174B on the blue pixel region ($P_B$), where a blue light of relatively short wavelength, is inputted is formed to have the greatest radius of a curvature.

Since a focal distance, which is a distance between a spot where a light is inputted and a spot where the incident light is concentrated, becomes shorter as a radius of a curvature increases or becomes smaller, a focal distance of a red light at the red pixel region ($P_B$) can be reduced.

The micro lens 176R on the red pixel region ($P_R$) may be formed to be a micro lens having a small radius of a curvature by the sub-micro lens 172r already formed and can completely cover the red pixel region ($P_R$). Thus, the micro lenses 174B, 176R and 178G having different radiuses of curvature may be formed on the unit pixel region ($P_R$, $P_G$, $P_B$), respectively. A space between the micro lenses may be prevented from being generated.

Thus, since a concentration efficiency of a light inputted to a micro lens can be improved and a loss of a light inputted to a micro lens can be reduced, a photo sensitivity of an image sensor can be improved.

Hereinafter, referring to FIGS. 9A, 10A and 11A and FIGS. 9B, 10B and 11B, another example embodiment of the present invention will be described. Like reference numerals refer to like elements throughout and a description of common features already discussed in an example embodiment will be omitted for brevity.

Figure 9A:
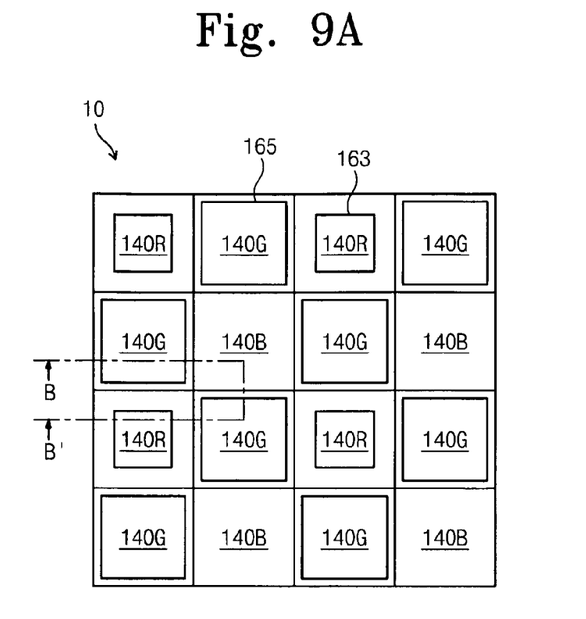
FIGS. 9A, 10A and 11A are top plan views illustrating a method of manufacturing an image sensor according to another example embodiment of the present invention.
Figure 9B:
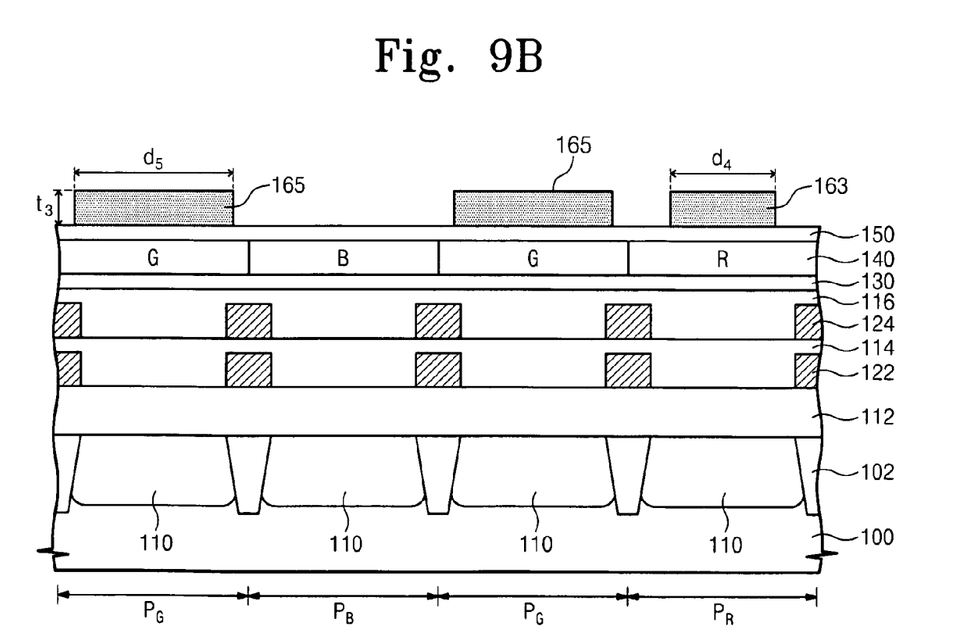
FIGS. 9B, 10B and 11B are cross sectional views taken along the line B-B' of respective FIGS. 9A, 10A and 11A illustrating a method of manufacturing an image sensor according to another example embodiment of the present invention.
Figure 10A:
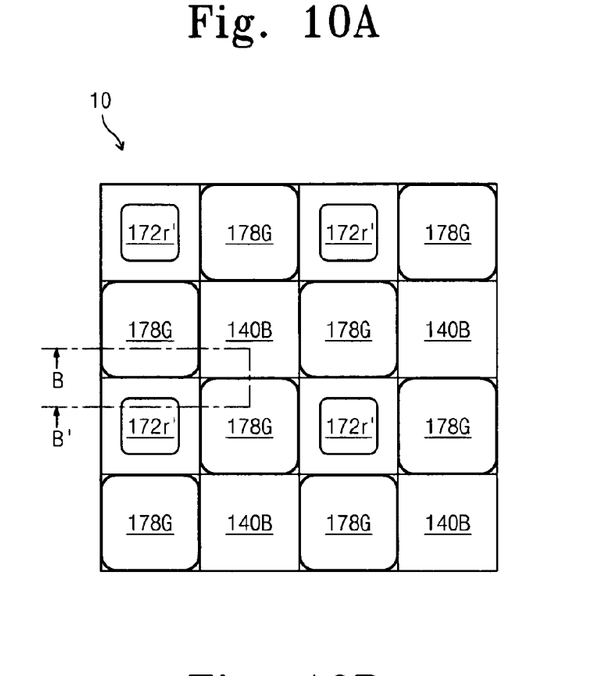
Figure 10B:
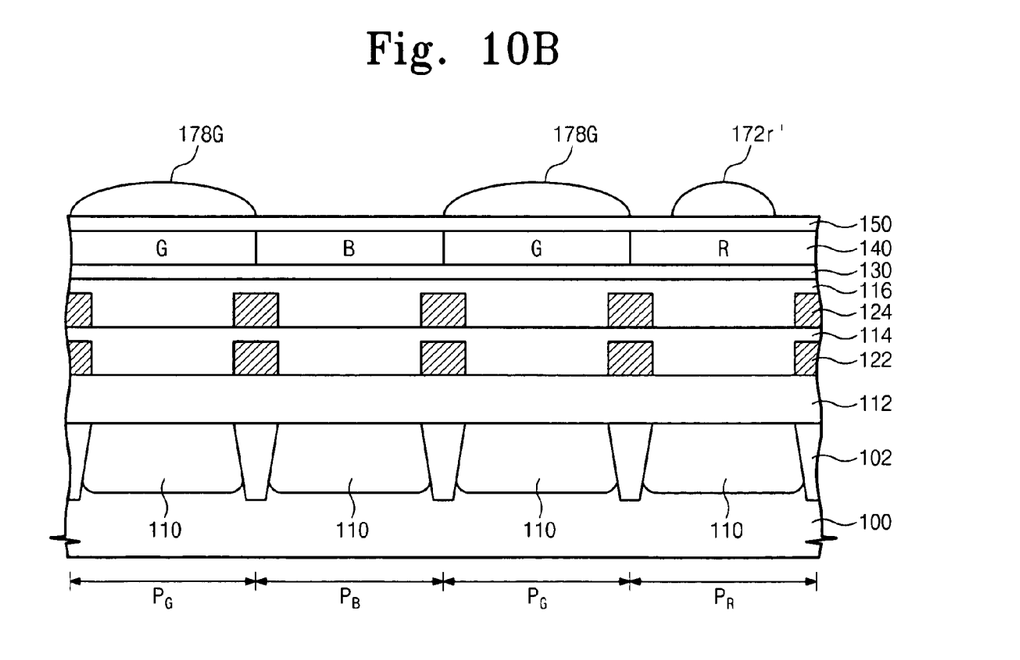
Figure 11A:
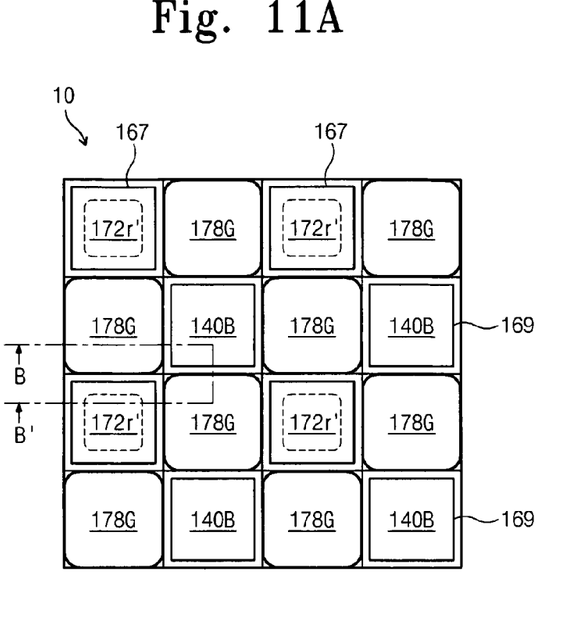
Figure 11B:
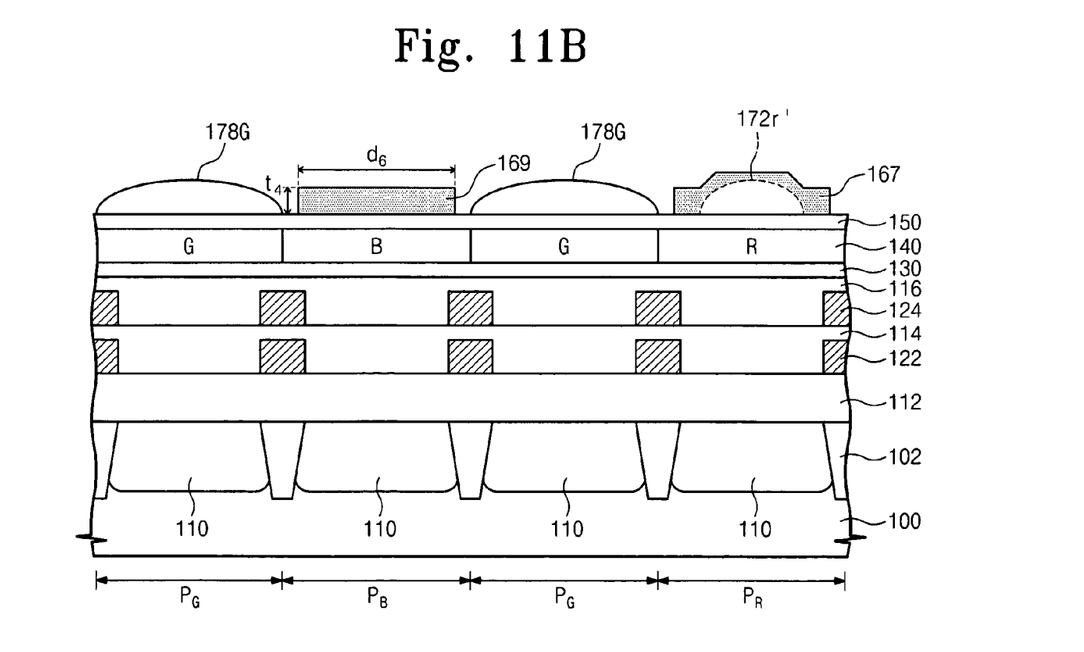

FIGS. 9A, 10A and 11A are top plan views illustrating a method of manufacturing an image sensor according to another example embodiment of the present invention. FIGS. 9B, 10B and 11B are cross sectional views taken along the line B-B' of respective FIGS. 9A, 10A and 11A illustrating a method of manufacturing an image sensor according to another example embodiment of the present invention.

In another example embodiment of the present invention, when micro lens are formed, a sub-micro lens 172r' on a red pixel region ($P_R$) and a third micro lens 178G on a green pixel region ($P_G$) may be formed first.

In more detail, as depicted in FIGS. 9A and 9B, a fifth pattern 163 and a sixth pattern 165 corresponding to the respective red pixel region ($P_R$) and the green pixel region ($P_G$) are formed.

After a light penetrating material is formed to have a third thickness ($t_3$) on an upper planarization layer 140, the light penetrating material is patterned to form the fifth and sixth patterns 163 and 165. Since a micro lens on the green pixel region ($P_G$) is formed first, the fifth and sixth patterns 163 and 165 may be formed to have a third thickness ($t_3$) greater than the first thickness ($t_1$) of the first and second patterns 162 and 164. The third thickness ($t_3$) may be a same thickness as the second thickness ($t_2$) of the fourth pattern 168.

The fifth pattern 163 on the red pixel region ($P_R$) is formed to have an area smaller than the sixth pattern 165. For example, a width ($d_4$) of the fifth pattern 163 may be smaller than a width ($d_5$) of the sixth pattern 165.

The fifth and sixth patterns 163 and 165 may be disposed on the same row and column of a plane. For example, the fifth and sixth patterns 163 and 165 may be disposed to be adjacent to each other.

As depicted in FIGS. 10A and 10B, the fifth and sixth patterns 163 and 165 reflow to form a sub-micro lens 172r' on the red pixel region ($P_R$) and a third micro lens 178G on the green pixel region ($P_G$).

Since the sub-micro lens 172r' formed by another example embodiment of the present invention is formed by the fifth pattern 163 having a thickness greater than the first pattern (162 of FIG. 5B) of an example embodiment, the sub-micro lens 172r' may have a radius of a curvature smaller than the sub-micro lens (172r of FIG. 6B).

The sub-micro lens 172r' can cover only a center of the red pixel region ($P_R$). The third micro lens (178G) can completely cover the green pixel region ($P_G$).

After the sub-micro lens 172r' and the third micro lens 178G are formed, a bake process may be performed.

Referring to FIGS. 11A and 11B, a seventh pattern 167 and a eighth pattern 169 corresponding to the respective red pixel region (PR) and the blue pixel region (PB) are formed.

In more detail, after depositing a light penetrating material, the light penetrating material is patterned to form the seventh and eighth patterns 167 and 169. The seventh and eighth patterns 167 and 169 may be formed to have an area different from the fifth and sixth patterns 163 and 165. For example, a width ($d_6$) of the seventh and eighth patterns 167 and 169 may be formed to be greater than the width ($d_5$) of the sixth pattern 165. The seventh and eighth patterns 167 and 169 may be formed to have a fourth thickness ($t_4$) smaller than the third thickness ($t_3$) of the sixth pattern 165.

Then, the seventh and eighth patterns 167 and 169 reflow to form the first micro lens 174B having a radius of a curvature greater than the third micro lens 178G and the second micro lens 176R covering the sub-micro lens 172r' on the red pixel region ($P_R$). For example, the first through third micro lenses 174B, 176R and 178G depicted in FIGS. 8A and 8B may be formed.

The foregoing is illustrative of example embodiments of the present invention and is not to be construed as limiting thereof. Although example embodiments of the present invention have been described, those skilled in the art will readily appreciate that many modifications are possible to example embodiments without materially departing from the novel teachings and advantages of the present invention. Accordingly, all such modifications are intended to be included within the scope of the present invention as defined in the claims. Therefore, it is to be understood that the foregoing is illustrative of example embodiments of the present invention and is not to be construed as limited to the specific embodiments disclosed, and that modifications to the disclosed example embodiments, as well as other embodiments, are intended to be included within the scope of the appended claims. The present invention is defined by the following claims, with equivalents of the claims to be included therein

What is claimed is:

1. A method of manufacturing an image sensor comprising:
   providing a semiconductor substrate including a first pixel region;
   first forming a first pattern on the first pixel region;
   first performing a reflow of the first pattern to form a sub-micro lens on the first pixel region;
   second forming a second pattern on the sub-micro lens; and
   second performing a reflow of the second pattern to form a first micro lens covering the sub-micro lens.

2. The method of claim 1, wherein,
   the providing a semiconductor substrate further includes a second pixel region,
   the first forming includes forming a third pattern on the second pixel region; and
   the first performing includes a reflow of the third pattern to form a second micro lens on the second pixel region.

3. The method of claim 2, wherein at least one of the first and second forming respectively form at least one of the first, second and third patterns to have at least one of different areas and thicknesses.

4. The method of claim 3, wherein the first forming forms the first and third patterns to have the at least one of different areas and thicknesses.

5. The method of claim 2, wherein the first performing forms the sub-micro lens to cover a center portion of the first pixel region and the second performing forms the first micro lens to cover an entire portion of the first pixel region.

6. The method of claim 2, wherein the providing provides the substrate having the first pixel region and the second pixel region on different rows and columns of the semiconductor substrate.

7. The method of claim 2, wherein the providing provides the substrate having the first pixel region and the second pixel region on one of a same row and column of the semiconductor substrate.

8. The method of claim 2, wherein,
the providing provides the substrate further having a third pixel region, and
the second forming includes forming a fourth pattern on the third pixel region when forming the second pattern.

9. The method of claim 8, wherein the providing provides the substrate having the third pixel region between the first pixel region and the second pixel region.

10. The method of claim 9, wherein the second forming forms the fourth pattern to have an area and a thickness different from an area and a thickness of the first and third patterns.

11. The method of claim 10, wherein the second forming forms the area of the fourth pattern greater than or less than the area of the third pattern.

12. The method of claim 10, wherein the second forming forms the thickness of the fourth pattern greater than or less than the thickness of the third pattern.

13. The method of claim 8, wherein the first and second forming respectively form the first, second, third and fourth patterns of a same light penetrating material.

14. The method of claim 8, further comprising:
third performing a reflow of the second and fourth patterns to form a third micro lens on the third pixel region.

15. The method of claim 14, further comprising:
third forming a photo conversion device on each of the first, second and third pixel regions of the semiconductor substrate;
fourth forming a color filter corresponding to each of the photo conversion devices,
wherein,
the first, second and third performing form the first, second and third micro lenses to correspond to the corresponding color filter.

16. The method of claim 15, further comprising:
inputting a light of a first wavelength to the photo conversion device of the first pixel region;
inputting a light of a second wavelength longer than the first wavelength to the photo conversion device of the second pixel region; and
inputting a light of a third wavelength longer than the first wavelength and shorter than the second wavelength to the photo conversion device of the third pixel region.

17. The method of claim 15, further comprising:
inputting a light of a first wavelength to the photo conversion device of the first pixel region;
inputting a light of a second wavelength longer than the first wavelength to the photo conversion device of the second pixel region; and
inputting a light of a third wavelength shorter than the first wavelength to the photo conversion device of the third pixel region.

18. A method of manufacturing an image sensor comprising:
providing a semiconductor substrate including first, second and third pixel regions;
first forming a first pattern on the first pixel region and a second pattern on the second pixel region;
first performing a reflow of the first and second patterns to form a sub-micro lens on the first pixel region and a first micro lens on the second pixel region;
second forming a third pattern on the sub-micro lens and a fourth pattern on the third pixel region; and
second performing a reflow of the third and fourth patterns to form a second micro lens covering the sub-micro lens and a third micro lens on the third pixel region.

19. The method of claim 18, wherein at least one of the first and second forming respectively form at least one of the first, second, third and fourth patterns to have at least one of different areas and thicknesses.

20. The method of claim 19, wherein the first forming forms the first and second patterns to have the same thickness and forms the area of the first pattern to be smaller than the area of the second pattern.

* * * * *